(12) United States Patent
Ding et al.

(10) Patent No.: US 10,903,167 B2
(45) Date of Patent: Jan. 26, 2021

(54) ELECTRONIC PACKAGE, PACKAGING SUBSTRATE, AND METHODS FOR FABRICATING THE SAME

(71) Applicant: Siliconware Precision Industries Co., Ltd., Taichung (TW)

(72) Inventors: Jun-Chang Ding, Taichung (TW); Hong-Da Chang, Taichung (TW); Hsi-Chang Hsu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 61 days.

(21) Appl. No.: 16/285,813

(22) Filed: Feb. 26, 2019

(65) Prior Publication Data

US 2020/0203277 A1 Jun. 25, 2020

(30) Foreign Application Priority Data

Dec. 21, 2018 (CN) .......................... 2018 1 1569234

(51) Int. Cl.
| | |
|---|---|
| *H01L 21/56* | (2006.01) |
| *H01L 23/538* | (2006.01) |
| *H01L 23/498* | (2006.01) |
| *H01L 23/532* | (2006.01) |
| *H01L 23/00* | (2006.01) |
| *H01L 23/31* | (2006.01) |

(52) U.S. Cl.
CPC ........ *H01L 23/5383* (2013.01); *H01L 21/561* (2013.01); *H01L 21/563* (2013.01); *H01L 21/566* (2013.01); *H01L 23/3157* (2013.01); *H01L 23/49822* (2013.01); *H01L 23/49838* (2013.01); *H01L 23/5386* (2013.01); *H01L 23/53228* (2013.01); *H01L 24/09* (2013.01); *H01L 24/17* (2013.01); *H01L 2224/0231* (2013.01); *H01L 2224/02379* (2013.01); *H01L 2224/02381* (2013.01); *H01L 2224/0401* (2013.01)

(58) Field of Classification Search
CPC ...................................................... H01L 21/563
See application file for complete search history.

(56) References Cited

U.S. PATENT DOCUMENTS

2020/0152616 A1* 5/2020 Kuo .................... H01L 24/19
2020/0203242 A1* 6/2020 Koduri ................. H01L 24/09

* cited by examiner

*Primary Examiner* — Douglas M Menz
(74) *Attorney, Agent, or Firm* — Mintz Levin Cohn Ferris Glovsky and Popeo, P.C.; Peter F. Corless; Steven M. Jensen

(57) ABSTRACT

An electronic package, a packaging substrate, and methods for fabricating the same are disposed. The electronic package includes a circuit structure having a first side and a second side opposing the first side, an electronic component disposed on the first side of the circuit structure, an encapsulation layer formed on the first side of the circuit structure and encapsulating the electronic component, a metal structure disposed on the second side of the circuit structure, and a plurality of conductive elements disposed on the metal structure. The plurality of conductive elements are disposed on the metal structure, rather than disposed on the circuit structure directly. Therefore, the bonding between the conductive elements and the circuit structure is improved, to avoid the plurality of conductive elements from being peeled.

9 Claims, 6 Drawing Sheets

ELECTRONIC PACKAGE, PACKAGING SUBSTRATE, AND METHODS FOR FABRICATING THE SAME

This application claims the benefit of Taiwanese Application No. 201811569234.2 filed on Dec. 21, 2018. The entire contents of this application is incorporated herein by reference in their entirety.

BACKGROUND

1. Technical Field

The present disclosure relates to semiconductor packaging processes, and, more particularly, to an electronic package, a packaging substrate, and methods for fabricating the same.

2. Description of the Prior Art

With the rapid development of electronic industry, an electronic product is generally designed to have various functionalities. Modern flip-chip package modules are brought to the market, including Chip Scale Package (CSP), Direct Chip Attached (DCA) and Multi-Chip Module (MCM). Chips can also be stacked to have a 3D IC chip stacked structure.

FIGS. 1A to 1F are cross-section views illustrating a method for fabricating a semiconductor package 1 according to the prior art.

As shown in FIG. 1A, a semiconductor structure is provided that comprises a glass board 10, a circuit portion 11 bonded onto the glass board 10 by an adhesive 100, a plurality of semiconductor chips 12 bonded onto the circuit portion 11 in a flip-chip manner, and an underfiller 13 formed between the circuit portion 11 and the semiconductor chips 12.

As shown in FIG. 1B, an encapsulation layer 14 is formed on the circuit portion 11 and encapsulates the semiconductor chips 12 and the underfiller 13.

As shown in FIG. 1C, a portion of the top of the encapsulation layer 14 is removed, to expose the semiconductor chips 12.

As shown in FIG. 1D, the glass board 10 and the adhesive 100 are removed, to expose the circuit portion 11.

As shown in FIG. 1E, an insulation protection layer 17 is formed on the circuit portion 11, with a portion of the circuit portion 11 exposed from the insulation protection layer 17, for a plurality fo solder balls 18 to be bonded onto the exposed portion of the circuit portion 11.

As shown in FIG. 1F, a singulation process is performed along a cutting path S shown in FIG. 1E, and a plurality of semiconductor packages 1 are thus obtained.

However, in the method for fabricating the semiconductor package 1 according to the prior art the adhesive 100 has to be used to bond the circuit portion 11 onto the glass board 10. After the removal of the adhesive 100, a plurality of particles of the adhesive 100 remain on the circuit portion 11. Therefore, the solder balls 18 cannot be bonded to the circuit portion 11 securely because of the poor bonding therebetween, and are likely separated from the circuit portion 11 in view of the lower reliability for bonding the solder balls 18.

Moreover, the solder material of the solder balls 18 likely spread outward owing to the formation of the remained particles of the adhesive 100, as a result, the solder balls 18 are likely to be short-circuited to one another.

Therefore, how to overcome the drawbacks of the prior art is becoming an urgent issue in the art.

SUMMARY

In view of the above-mentioned drawbacks of the prior art, the present invention provides an electronic package, a packaging substrate, and methods for fabricating the same, to improve the bonding of conductive elements to a circuit structure.

In an embodiment, an electronic package according to the present invention comprises: a circuit structure having a first side and a second side opposing the first side; at least one electronic component disposed on the first side of the circuit structure; an encapsulation layer formed on the first side of the circuit structure and encapsulating the at least one electronic component; a metal structure disposed on the second side of the circuit structure; and a plurality of conductive elements disposed on the metal structure.

In another embodiment, a method for fabricating an electronic package according to the present invention comprises: forming on a carrier a bonding layer and a circuit structure having a first side and a second side opposing the first side and bonded to the bonding layer; disposing at least one electronic component on the first side of the circuit structure; forming on the first side of the circuit structure an encapsulation layer that encapsulates the at least one electronic component; removing the carrier and the bonding layer; forming a metal structure on the second side of the circuit structure; and disposing a plurality of conductive elements on the metal structure.

In yet another embodiment, a packaging substrate according to the present invention comprises: a circuit structure having a first side and a second side opposing the first side; a metal structure disposed on the second side of the circuit structure; and a plurality of conductive elements disposed on the metal structure.

In still another embodiment, a method for fabricating a packaging substrate according to the present invention comprises: forming on a carrier a bonding layer and a circuit structure having a first side and a second side opposing the first side and bonded to the bonding layer; removing the carrier and the bonding layer; forming a metal structure on the second side of the circuit structure; and disposing a plurality of conductive elements on the metal structure.

In an embodiment, the metal structure is formed in a sputtering process.

In an embodiment, the encapsulation layer does not encapsulate a portion of a surface of the electronic component.

In an embodiment, the circuit structure comprises an insulation layer and a circuit layer bonded to the insulation layer and electrically connected to the electronic component.

In an embodiment, a plurality of conductive pads are disposed on the second side of the circuit structure, and the metal structure is disposed on the plurality of conductive pads only.

In an embodiment, the metal structure is a copper layer.

In an embodiment, the metal structure is electrically connected to the circuit structure.

In an embodiment, the conductive elements are electrically connected via the metal structure to the circuit structure.

In an embodiment, under bump metallurgy is disposed between the conductive elements and the metal structure.

It is known from the above that in the electronic package, the packaging substrate, and the methods for fabricating the same according to the present invention the metal structure is disposed on the circuit structure, the plurality of conductive elements are disposed on the metal structure, and the metal structure acts as a signal transmission medium between the circuit structure and the conductive elements. According to the present invention, after the bonding layer is removed, even if a plurality of particles of the bonding layer remain on the circuit structure, the metal structure will cover the particles. Therefore, the conductive elements will be bonded to the metal structure securely. In other words, the metal structure can improve the bonding of the conductive elements to the circuit structure, and the plurality of conductive elements will not be likely to be separated from the circuit structure.

According to the present invention, the the metal structure covers the remaining particles of the bonding layer, and the material of the plurality of conductive elements will not spread outward. Therefore, the plurality of conductive elements will not suffer from the short-circuit problems.

BRIEF DESCRIPTION OF THE DRAWINGS

The invention can be more fully understood by reading the following detailed description of the preferred embodiments, with reference made to the accompanying drawings, wherein:

FIG. 2E' is an enlarged view of a portion of FIG. 2E;

FIG. 2G' is an enlarged view of a portion of another embodiment of FIG. 2G;

FIG. 3D' is another embodiment of FIG. 3D.

DETAILED DESCRIPTION

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

FIGS. 2A to 2G are cross-sectional views illustrating a method for fabricating an electronic package 2 according to the present invention.

Figure 1A:
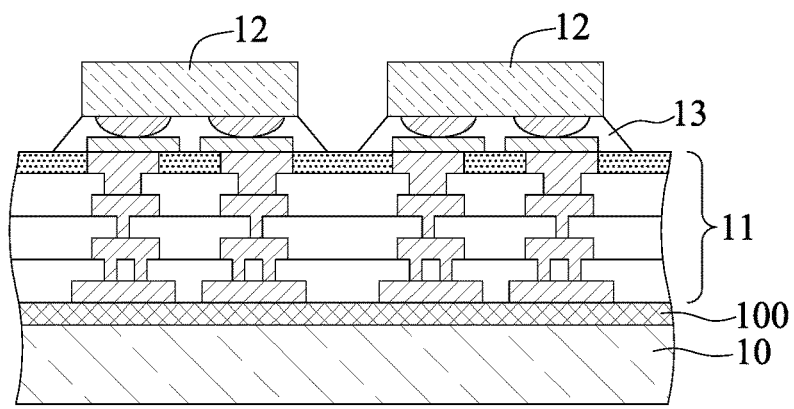
FIGS. 1A to 1F are cross-sectional views illustrating a method for fabricating a semiconductor package according to the prior art.
Figure 1B:
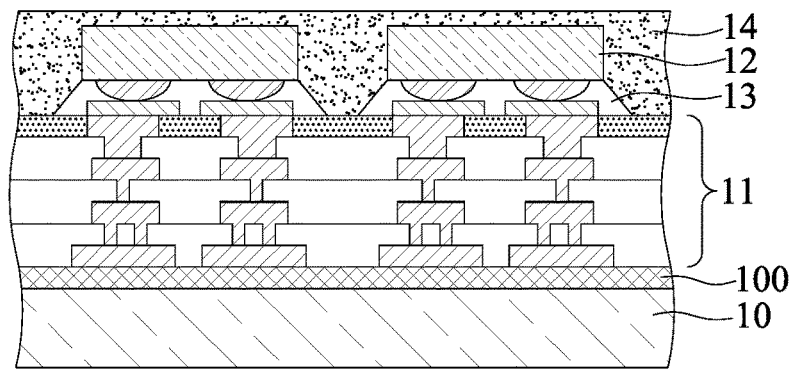
Figure 1C:
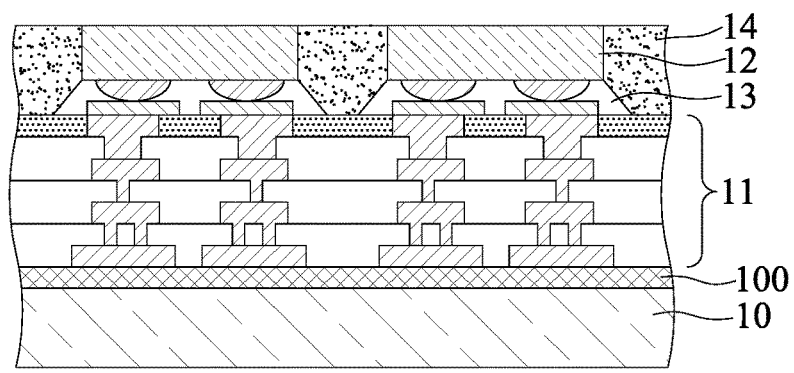
Figure 1D:
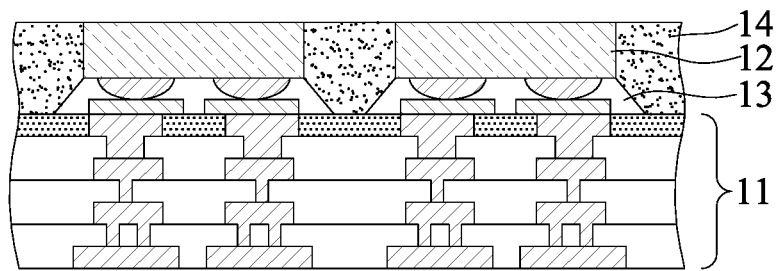
Figure 1E:
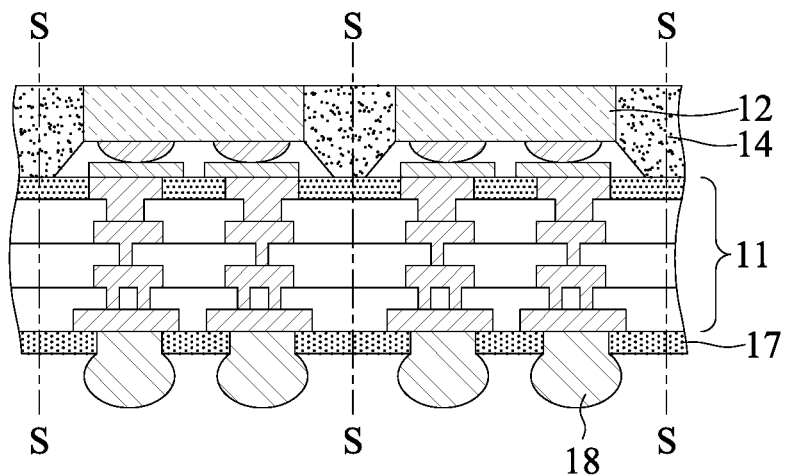
Figure 1F:
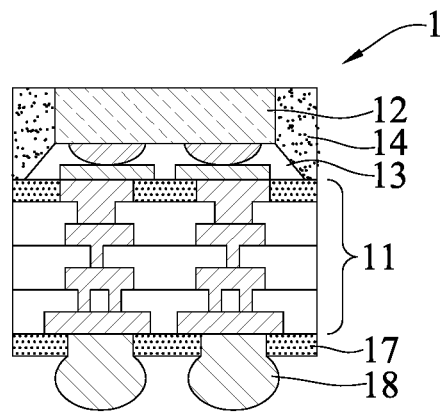
Figure 2A:
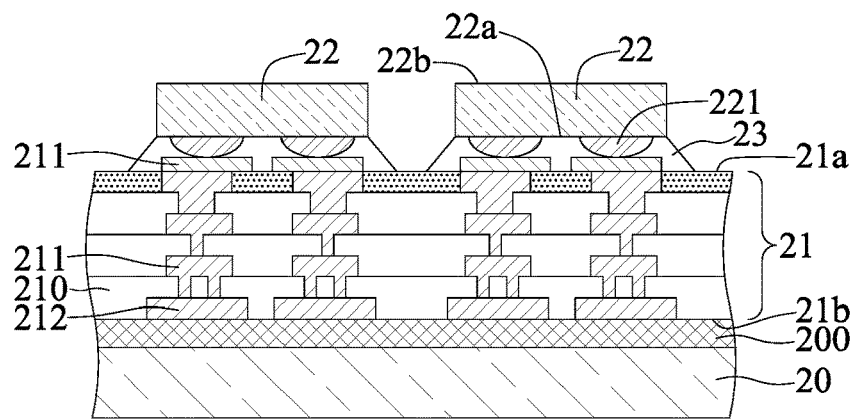
FIGS. 2A to 2G are cross-sectional views illustrating a method for fabricating an electronic package according to the present invention.

As shown in FIG. 2A, a carrier 20 is provided, a circuit structure 21 is disposed on the carrier 20, a plurality of (or at least one) electronic components 22 are disposed on the circuit structure 21, and an underfill 23 is formed between the circuit structure 21 and the electronic components 22.

In an embodiment, the carrier 20 is made of macromolecular organic substance, glass or metal, or is a semiconductor substrate (e.g., a silicon substrate).

In an embodiment, the circuit structure 21 is a packaging substrate having a core layer and a circuit structure or a coreless circuit structure. The circuit structure 21 is defined with a first side 21a and a second side 21b opposing the first side 21a and bonded to the carrier 20. In an embodiment, the circuit structure 21 comprises a plurality of insulation layers 210 and a plurality of circuit layers 211 bonded to the insulation layers 210, and a plurality of conductive pads 212 are embedded in the insulation layers 210 on the second side 21b of the circuit structure 21. In an embodiment, the circuit structure 21 is fabricated in a fan out redistribution layer (RDL) process, a Dual Damascene structure process, or any other processes. In the Dual Damascene structure process, an oxide layer and a nitride layer are formed first to act as the insulation layers 210, the oxide layer and the nitride layer are then etched to form vias, a titanium layer or a copper layer is formed by deposition, sputtering or electroplating to act as a conductive layer, a copper layer is electroplated to form the circuit layer 211, and a surplus conductive layer is removed.

In an embodiment, the carrier 20 is bonded to the second side 21b of the circuit structure 21 via a bonding layer 200, such as a releasing film, which can be removed by heating, for example. In another embodiment, the carrier 20 is a glass board (or made of a transparent material), and the bonding layer 200 can be removed by laser illumination.

In an embodiment, the electronic component 22 is an active component, such as a semiconductor chip, or a passive component, such as a resistor, a capacitor and an inductor, or a combination thereof. In an embodiment, the electronic component 22 is an active component and has an active surface 22a and an inactive surface 22b opposing the active surface 22a. In an embodiment, the electronic component 22 is disposed in a flip-chip manner on and electrically connected to the circuit layer 211 on the first side 21a of the circuit structure 21, with the active surface 22a bonded to the circuit layer 211 via conductive bumps 221, such as a solder material. The underfill 23 covers the conductive bumps 221. In another embodiment, the electronic component 22 is electrically connected to the circuit layer 211 via a plurality of solder wires (not shown). In yet another embodiment, the electronic component 22 is in direct contact with the circuit layer 211. In still another embodiment, the electronic component 22 is electrically connected to the circuit layer 211 in other ways, not limited to those mentioned above.

Figure 2B:
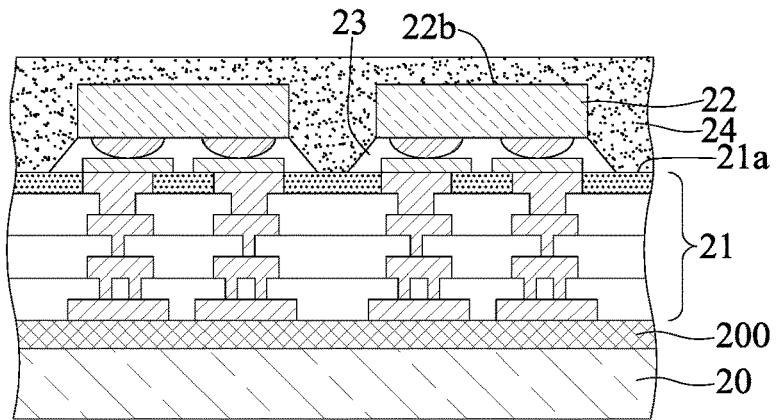

As shown in FIG. 2B, a molding process is performed to form on the first side 21a of the circuit structure 21 an encapsulation layer 24 that encapsulates the electronic components 22 and the underfill 23.

Figure 2C:
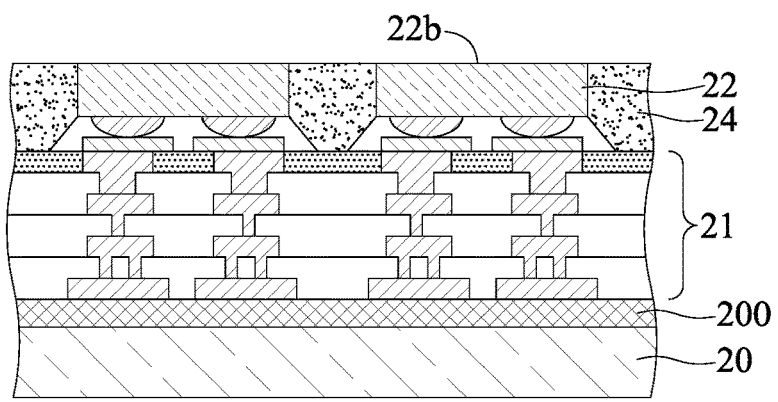

As shown in FIG. 2C, the top of the encapsulation layer 24 is removed on demands, to expose the inactive surfaces 22b of the electronic component 22, for heat to be dissipated therefrom.

Figure 2D:
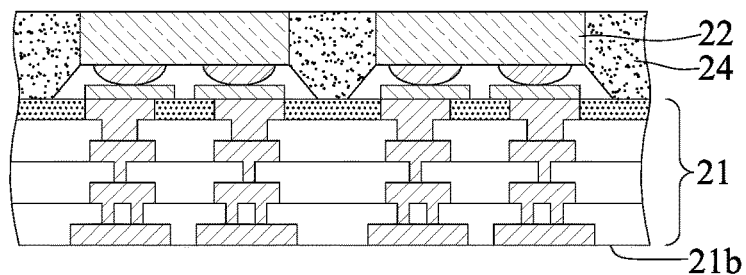

As shown in FIG. 2D, the carrier 20 and the bonding layer 200 are removed, to expose the second side 21b of the circuit structure 21.

In an embodiment, the carrier 20 is separated from the circuit structure 21 by the bonding layer 200.

Figure 2E:
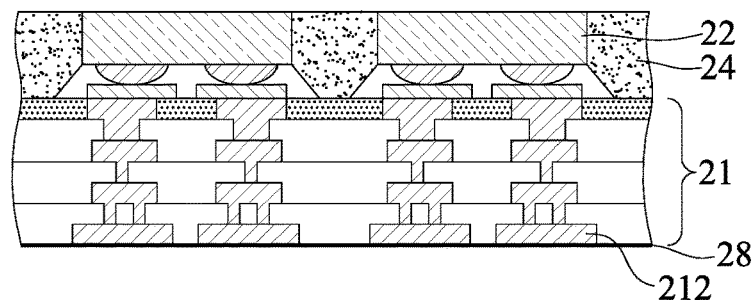
Figure 2E:
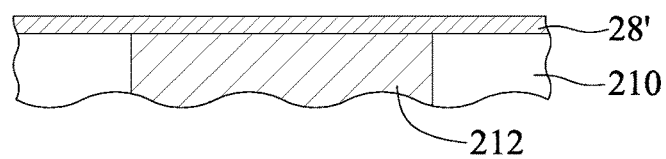

As shown in FIG. 2E, a metal structure 28 is disposed on the second side 21b of the circuit structure 21, and is in contact with the insulation layers 210 and the conductive pads 212 of the circuit structure 21.

In an embodiment, the metal structure 28 is a single layer of metal, such as a copper layer 28' sputtered on the second side 21b of the circuit structure 21, as shown in FIG. 2E'.

Figure 2F:
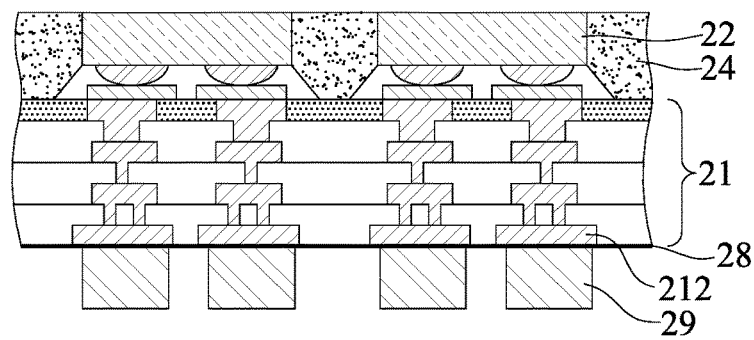

As shown in FIG. 2F, a plurality of conductive elements 29, such as a solder material or metal bumps (e.g., copper bumps), are disposed on the metal structure 28.

In an embodiment, the plurality of conductive elements 29 are formed by electroplating or printing. The conductive elements 29 can be formed by other methods, not limited to those mentioned above.

Figure 2G:
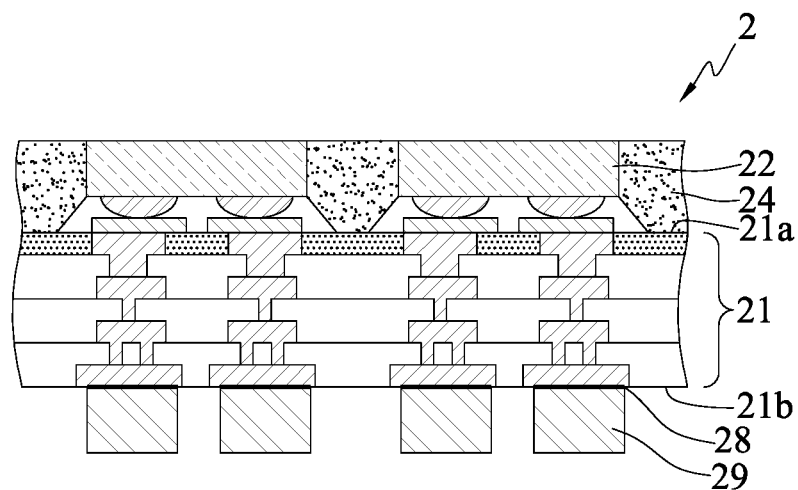
Figure 2G:
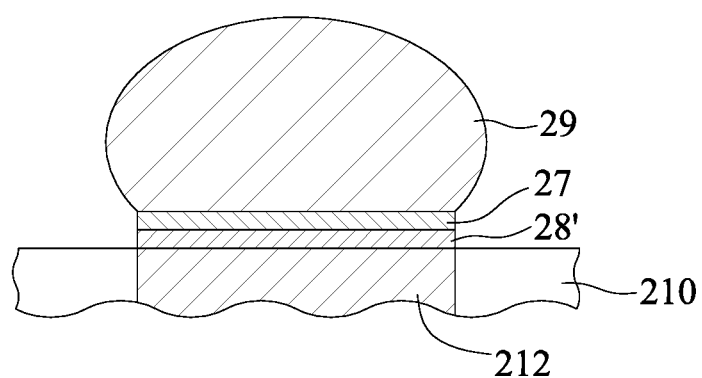

As shown in FIG. 2G, the conductive elements 29 are taken as an etching resist layer, and a portion of the metal structure 28 exposed from the conductive elements 29 is removed, to form a patterned metal structure 28 (i.e., the position of the patterned metal structure 28 corresponding to the position of the plurality of conductive elements 29), to allow the conductive elements 29 to be electrically connected via the patterned metal structure 28 (the remaining portion of the metal structure 28) to the plurality of conductive pads 212.

In an embodiment, under bump metallurgy (UBM) 27 can be formed on the metal structure 28 (or the sputtered copper layer 28') on demands, to facilitate the bonding to the conductive elements 29, as shown in FIG. 2G'.

A singulation process is then performed, to obtain a plurality of electronic packages 2, allowing the electronic packages 2 to be bonded to an electronic device (not shown), such as a circuit board, by reflowing the plurality of conductive elements 29.

According to the present invention, the metal structure 28 is formed, and the plurality of conductive elements 29 are then formed, to allow the metal structure 28 to act as the signal transmission medium between the circuit layer 211 (or the conductive pads 212) and the conductive elements 29. According to the present invention, after the bonding layer 200 is removed, even if a plurality of particles of the bonding layer 200 still remain on the circuit layer 211 (or the conductive pads 212) and/or the insulation layer 210, the plurality of particles of the bonding layer 200 will be covered by the metal structure 28. Therefore, the conductive elements 29 formed subsequently can be bonded to the metal structure 28 securely. The formation of the metal structure 28 can improve the bonding of the conductive elements 29 to the circuit layer 211 (or the conductive pads 212). According to the present invention, the plurality of conductive elements 29 can be prevented from separation, and the quality of thus fabricated product is improved.

According to the present invention, the metal structure 28 covers the remaining particles of the bonding layer 200, so that the material to be made into the plurality of conductive elements 29 will not spread outward. Compared with the prior art, the present invention can effectively avoid the short-circuit problem from occurring among the plurality of conductive elements 29.

According to the present invention, the conductive elements 29 are taken as an etching resist layer, without the need of forming the prior art insulation protection layer, allowing the insulation layer 210 on the second side 21b of the circuit structure 21 to be exposed and no insulation material to be formed around the metal structure 28. Therefore, the electronic package 2 costs less.

FIGS. 3A to 3D are cross-sectional views illustrating a method for fabricating a packaging substrate 3 according to the present invention.

Figure 3A:
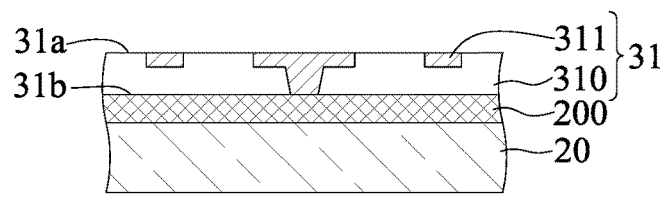
FIGS. 3A to 3D are cross-sectional views illustrating a method for fabricating a packaging substrate according to the present invention.

As shown in FIG. 3A, a carrier 20 is provided, and a circuit structure 31 is disposed on the carrier 20.

In an embodiment, the circuit structure 31 is a packaging substrate having a core layer and a circuit structure or a coreless circuit structure. The circuit structure 31 is defined with a first side 31a and a second side 31b opposing the first side 31a and bonded to the carrier 20. The circuit structure 31 comprises a plurality of insulation layers 310 and a circuit layer 311 bonded to the insulation layers 310. In an embodiment, the circuit structure 31 is fabricated in a fan out circuit layer redistribution layer (RDL) process, a Dual Damascene structure process or any other process. In the Dual Damascene structure process, an oxide layer and a nitride layer are formed first to act as an insulation layer 310, the oxide layer and the nitride layer are then etched to form vias, a titanium layer or a copper layer is formed by chemical deposition, sputtering or electroplating to act as a conductive layer, the copper layer is electroplated to form a circuit layer 311, and lastly the surplus conductive layer is removed.

In an embodiment, the carrier 20 can be bonded to the second side 31b of the circuit structure 31 via a bonding layer 200, such as a releasing film.

Figure 3B:
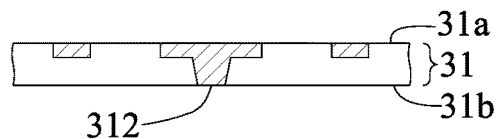

As shown in FIG. 3B, the carrier 20 and the bonding layer 200 are removed, to expose the second side 31b of the circuit structure 31, allowing a portion of the circuit layer 311 exposed from the second side 31b to act as conductive pads 312, such as end surfaces of the conductive vias.

In an embodiment, the carrier 20 is separated from the circuit structure 31 by the bonding layer 200.

Figure 3C:
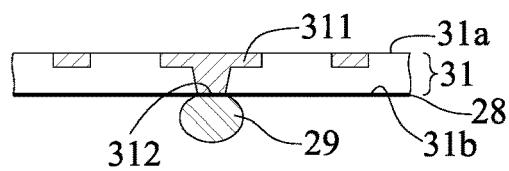

As shown in FIG. 3C, a metal structure 28 is disposed on the second side 31b of the circuit structure 31 and in contact with the insulation layers 310 and the conductive pads 312 of the circuit structure 31. A plurality of conductive elements 29, such as a solder material or metal bumps (e.g., copper bumps), are disposed on the metal structure 28.

Figure 3D:
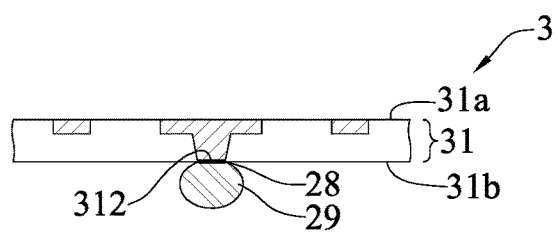
Figure 3D:
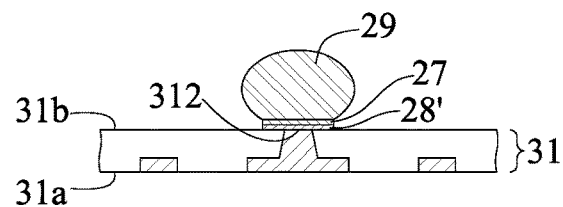

In an embodiment, the metal structure 28 is a single layer of metal, formed by sputtering the sputtered copper layer 28' on the second side 31b of the circuit structure 31, as shown in FIG. 3D'.

The plurality of conductive elements 29 are formed by electroplating or printing.

As shown in FIG. 3D, the conductive elements 29 are taken as an etching resist layer, a portion of the metal structure 28 exposed from the conductive elements 29 is removed, to form a patterned metal structure 28 (i.e., the position of the patterned metal structure 28 corresponding to the position of the plurality of conductive elements 29), and the conductive elements 29 are electrically connected via the patterned metal structure 28 (the remaining portion of the metal structure 28) to the plurality of conductive pads 312.

In an embodiment, under bump metallurgy (UBM) 27 can be formed on the metal structure 28 (or the sputtered copper layer 28') on demands, to facilitate the bonding to the conductive elements 29, as shown in FIG. 3D'.

A singulation process is performed to obtain a plurality of packaging substrates 3.

According to the present invention, the metal structure 28 is formed, the plurality of conductive elements 29 are then formed, and the metal structure 28 is taken as a signal transmission medium between the circuit layer 311 (or the conductive pads 312) and the conductive elements 29. According to the present invention, after the bonding layer 200 is removed, even if a plurality of particles of the bonding layer 200 remain on the circuit layer 311 (or the conductive pads 312) and/or the insulation layers 310, the metal structure 28 will cover the plurality of particles, allowing the conductive elements 29 formed subsequently to be bonded to the metal structure 28 securely. The formation of the metal structure 28 improves the bonding of the conductive elements 29 to the circuit layer 311 (or the conductive pads 312). Therefore, the plurality of conductive elements 29 can be prevented from separation, and the quality of the product thus fabricated can be improved.

According to the present invention, the metal structure 28 covers the surplus particles of the bonding layer 200, to prevent the material of the plurality of conductive elements 29 from spreading outward. Compared with the prior art, the present invention can prevent the short-circuit problem from occurring among the plurality of conductive elements 29.

According to the present invention, the conductive elements 29 are taken as an etching resist layer, without the need of forming the prior art insulation protection layer, so that the insulation layers 310 on the second side 31b of the circuit structure 31 are exposed and no insulation material is around the metal structure 28. Therefore, the packaging substrate 3 thus fabricated has a low cost.

The present invention provides an electronic package 2, which comprises a circuit structure 21 having a first side 21a and a second side 21b opposing the first side 21a, a plurality of electronic components 22 disposed on the first side 21a of the circuit structure 21, an encapsulation layer 24 formed on the first side 21a of the circuit structure 21 and encapsulating the electronic components 22, a metal structure 28 disposed on the second side 21b of the circuit structure 21, and a plurality of conductive elements 29 disposed on the metal structure 28.

The circuit structure 21 comprises a plurality of insulation layers 210 and a plurality of circuit layers 211 bonded to the insulation layers 210 and electrically connected to the electronic components 22. A plurality of conductive pads 212 are embedded in the insulation layers 210 on the second side 21b of the circuit structure 21.

Each of the electronic components 22 has an active surface 22a electrically connected to the circuit layer 211 and an inactive surface 22b opposing the active surface 22a.

The metal structure 28 is disposed on the conductive pads 212 only.

In an embodiment, the encapsulation layer 24 does not encapsulate the inactive surfaces 22b of the electronic components 22.

In an embodiment, the metal structure 28 is a copper layer.

In an embodiment, the metal structure 28 is electrically connected to the conductive pads 212 of the circuit structure 21.

In an embodiment, the conductive elements 29 are electrically connected via the metal structure 28 to the conductive pads 212 of the circuit structure 21.

In an embodiment, the electronic package 2 further comprises under bump metallurgy 27 disposed between the conductive elements 29 and the metal structure 28.

The present invention further provides a packaging substrate 3, which comprises a circuit structure 21, 31 having a first side 21a, 31a and a second side 21b, 31b opposing the first side 21a, 31a, a metal structure 28 disposed on the second side 21b, 31b of the circuit structure 21, 31, and a plurality of conductive elements 29 disposed on the metal structure 28.

The circuit structure 21, 31 comprises a plurality of insulation layers 210, 310 and a plurality of circuit layers 211, 311 bonded to the insulation layers 210, 310. A plurality of conductive pads 212, 312 are disposed on the second side 21b, 31b of the circuit structure 21, 31.

The metal structure 28 is disposed on the conductive pads 212, 312 only.

In an embodiment, the metal structure 28 is a copper layer.

In an embodiment, the metal structure 28 is electrically connected to the conductive pads 212, 312 of the circuit structure 21, 31.

In an embodiment, the conductive elements 29 are electrically connected via the metal structure 28 to the conductive pads 212, 312 of the circuit structure 21, 31.

In an embodiment, the packaging substrate 3 further comprises under bump metallurgy 27 disposed between the conductive elements 29 and the metal structure 28.

According to an electronic package, a packaging substrate, and methods for fabricating the same, the plurality of conductive elements are disposed on the metal structure, rather than disposed on the conductive pads directly. Therefore, the conductive elements can be bonded to the metal structure securely, and the bonding of the conductive elements to the circuit structure can be improved, to prevent the plurality of conductive elements from separation and improve the quality of the product thus fabricated.

According to the present invention, the metal structure covers the surplus particles of the bonding layer, preventing the material of the plurality of conductive elements from spreading outward. Therefore, the short-circuit problem will not occur among the plurality of conductive elements.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A method for fabricating an electronic package, comprising:
    forming on a carrier a bonding layer and a circuit structure having a first side and a second side opposing the first side and bonded to the bonding layer;
    disposing at least one electronic component on the first side of the circuit structure;
    forming on the first side of the circuit structure an encapsulation layer that encapsulates the at least one electronic component;
    removing the carrier and the bonding layer;
    forming a metal structure on the second side of the circuit structure;
    disposing a plurality of conductive elements on the metal structure; and
    after disposing the plurality of conductive elements on the metal structure, removing a portion of the metal structure exposed from the conductive elements.

2. The method of claim 1, wherein the circuit structure comprises an insulation layer and a circuit layer bonded to the insulation layer and electrically connected to the at least one electronic component.

3. The method of claim 1, further comprising a plurality of conductive pads disposed on the second side of the circuit structure, wherein the metal structure is disposed on the plurality of conductive pads only.

4. The method of claim 1, wherein the encapsulation layer does not encapsulate a portion of a surface of the at least one electronic component.

5. The method of claim 1, wherein the metal structure is a copper layer.

6. The method of claim 1, wherein the metal structure is electrically connected to the circuit structure.

7. The method of claim 1, wherein the plurality of conductive elements are electrically connected via the metal structure to the circuit structure.

8. The method of claim 1, further comprising under bump metallurgy disposed between the plurality of conductive elements and the metal structure.

9. The method of claim 1, wherein the metal structure is fabricated in a sputtering process.

\* \* \* \* \*